United States Patent
Lin

(10) Patent No.: US 9,568,542 B2
(45) Date of Patent: Feb. 14, 2017

(54) MEMORY INTERFACE WITH INTEGRATED TESTER

(71) Applicant: Cavium, Inc., San Jose, CA (US)

(72) Inventor: David Lin, Westborough, MA (US)

(73) Assignee: Cavium, Inc., San Jose, CA (US)

( * ) Notice: Subject to any disclaimer, the term of this patent is extended or adjusted under 35 U.S.C. 154(b) by 718 days.

(21) Appl. No.: 14/036,709

(22) Filed: Sep. 25, 2013

(65) Prior Publication Data

US 2015/0088437 A1   Mar. 26, 2015

(51) Int. Cl.
G01R 31/28 (2006.01)
G11C 29/02 (2006.01)
G11C 29/56 (2006.01)

(52) U.S. Cl.
CPC ......... *G01R 31/2834* (2013.01); *G11C 29/022* (2013.01); *G11C 29/023* (2013.01); *G11C 29/56012* (2013.01); *G11C 2029/5602* (2013.01)

(58) Field of Classification Search
CPC ............. G01R 31/2834; G11C 29/56012; G11C 29/023; G11C 29/022; G11C 2029/5602
See application file for complete search history.

(56) References Cited

U.S. PATENT DOCUMENTS

| 6,477,674 B1* | 11/2002 | Bates | G01R 31/31716 714/738 |
| 2007/0047337 A1* | 3/2007 | Iizuka | G11C 7/1066 365/193 |
| 2013/0278290 A1* | 10/2013 | Wang | H03K 19/017581 326/41 |

OTHER PUBLICATIONS

"System-on-Chip Test Architectures, Nanometer Design for Testability, A volume in Systems on Silicon", Edited by: Wang et al (Chapter 14—High-Speed I/O Interfaces ; Li et al), ISBN: 978-0-12-373973-5, Copyright © 2008 Elsevier Inc.*
Wang et al., "System-on-Chip Test Architectures, Nanometer Design for Testability, A volume in Systems on Silicon", Edited by: Wang et al (Chapter 14—High-Speed I/O Interfaces; Li et al), Copyright © 2008 Elsevier Inc.*

* cited by examiner

*Primary Examiner* — April Y Blair
*Assistant Examiner* — Rong Tang
(74) *Attorney, Agent, or Firm* — Hamilton, Brook, Smith & Reynolds, P.C.

(57) ABSTRACT

In an embodiment, a memory interface includes integrated circuitry to verify the integrity of the memory interface. The circuitry propagates a test pattern through different paths of the memory interface, and checks the result against a reference value to determine whether the components of the paths are operating within an acceptable tolerance. The memory interface can also communicate with ATE to initiate such tests and return the results to the ATE.

23 Claims, 7 Drawing Sheets

MEMORY INTERFACE WITH INTEGRATED TESTER

BACKGROUND

Semiconductor device manufacturers are responsible for validating the integrated circuitry they produce before shipping products to customers. Automated test equipment (ATE) is an apparatus that can rapidly test and verify the operation of a semiconductor device using a number of automated tests and measurements. By using an ATE apparatus, vendors can administer many different test patterns to validate each transistor of a semiconductor device. Because of the substantial expense of ATE and the large number of devices that a typical vendor must verify, it is beneficial to minimize the time consumed by ATE validation for each semiconductor device.

Typical memory controller devices are semiconductor devices that include a memory array, a memory controller and a memory interface. In order to test and validate a memory interface using ATE, the memory controller device can be connected, via external pin connections, to a tester capable of emulating an external memory (or a device accessing a memory), and providing simulated responses back to the memory controller device. Under such a configuration, the ATE can operate the memory interface through simulated memory access operations, and verify that each transmit and receive path (and, by extension, the circuit components of each path) are working properly. A memory interface that fails the testing can be discarded or recalibrated and then subjected to further testing under the ATE.

SUMMARY

Example embodiments of the present invention provide a memory interface including circuitry to conduct multiple different tests of the memory interface at a desired operating frequency. The included circuitry may create multiple different loops along the paths of the memory interface, propagate test patterns through those loops, and verify whether the patterns were properly propagated. Based on the results, it can be determined whether the components of the paths are operating within an acceptable tolerance. The memory interface can also communicate with ATE and a memory controller to initiate such tests and return the results to the ATE. As a result of embodiments of the invention, testing of a memory interface can be extended beyond ATE, and testing can be conducted at a frequency matching the intended operating frequency of the memory interface.

In an example embodiment, a circuit includes one or more data lines and a data strobe line. The data line may include a transmit channel and a receive channel connected in parallel to a data pin, where the transmit channel includes a transmit amplifier and a transmit latch, and the receive channel includes a receive amplifier and a receive latch. The data strobe line includes a strobe transmit channel and a strobe receive channel connected in parallel to a data strobe pin, where the strobe transmit channel is connected to a clock input of the transmit latch, and the strobe receive channel is connected to a clock input of the receive latch. A pattern generator may be connected to the transmit channel, and a control circuit may be configured to actuate the pattern generator to generate a pattern signal to the transmit channel. Further, a pattern checker may be connected to the receive channel and is configured to receive the pattern signal at the receive channel and output a verify signal indicating integrity of the pattern signal.

In further embodiments, the circuit may include one or both of a first and a second multiplexer connected to the data line, where the first multiplexer is connected in series to the receive channel between the receive amplifier and the receive latch and the second multiplexer is connected in series to the transmit line between a data source and the transmit latch. The first multiplexer may have a second input connected to the transmit channel at a node between the transmit latch and the transmit amplifier, and the control circuit may control the first multiplexer to selectively bypass the transmit amplifier and receive amplifier during propagation of the pattern signal. The second multiplexer may have further input connected to the pattern generator. The control circuit may control the pattern generator and first and second latches to selectively propagate the pattern signal through at least one of a first and second path through at least a subset of the data line. The first path may include the transmit latch and the receive latch and exclude the transmit amplifier and receive amplifier, and the second path may include the transmit latch, transmit amplifier, receive amplifier and receive latch.

In yet further embodiments, the strobe transmit channel and the strobe receive channel may include a strobe transmit amplifier and a strobe receive amplifier, respectively. A first variable phase shifter may be connected at the strobe transmit channel and include an input connected to a clock source and an output connected to the clock input of the transmit latch. A second variable phase shifter may be connected at the strobe receive channel and include an input connected to the strobe receive amplifier and an output connected to the clock input of the receive latch. The strobe transmit channel may further include first and second multiplexers, where the first multiplexer has inputs connected to the output of the first variable phase shifter and an output of a strobe receive amplifier, and the second multiplexer has inputs connected to the output of the second variable phase shifter and the output of the strobe receive amplifier. In such a configuration, the control circuit may control the first and second multiplexers to selectively bypass the strobe receive amplifier and the second variable phase shifter during propagation of a clock signal from the clock source. The control circuit may be further configured to control the first and second multiplexers to selectively enable a clock signal from the clock source through at least one of a first and second path through at least a subset of the data strobe line. In particular, the first path may include the first variable phase shifter and the second variable phase shifter and exclude the strobe transmit amplifier and strobe receive amplifier, and the second path may include the strobe transmit amplifier and strobe receive amplifier and exclude the first variable phase shifter and the second variable phase shifter. The control circuit may vary the delay of at least one of the first and second variable phase shifters. This variation may be based on an output (e.g., a verify signal) of the pattern checker, and can be used to calibrate the circuit or test the tolerance of the circuit.

In still further embodiments, the control circuit may be further configured to actuate the pattern generator based on a command signal from an automated testing equipment (ATE) device. The pattern generator may generate the pattern signal at a frequency higher than a frequency of test signals transmitted to the circuit from the ATE device. The higher frequency may be comparable to an intended operating frequency of the circuit. The pattern generator, control circuit, pattern checker and at least a portion of the data line and data strobe line may be implemented in a common integrated circuit (IC).

In still further embodiments, a method of verifying operation of a memory interface may include transmitting a pattern signal through a path through at least a portion of a data line, the data line having a transmit channel and a receive channel connected in parallel to a data pin. The pattern signal may be received at a termination of the path and compared to a reference value. Based on the comparison, a verify signal may be output indicating the integrity of the pattern signal. The path may be selected from first and second selectable paths. The first path may include a transmit latch and a receive latch and excludes a transmit amplifier and a receive amplifier, and the second path may include the transmit latch, transmit amplifier, receive amplifier and receive latch.

In further embodiments, a clock signal may be transmitted through a strobe path through at least a subset of a data strobe line, the data strobe line having a strobe transmit channel and a strobe receive channel connected in parallel to a data strobe pin. The strobe path may be selected from one of a first strobe path and a second strobe path. The first strobe path may includes a first variable phase shifter and a second variable phase shifter and excludes a strobe transmit amplifier and a strobe receive amplifier, and the second strobe path may include the strobe transmit amplifier and strobe receive amplifier and excludes the first variable phase shifter and the second variable phase shifter. The delay of at least one of the first and second variable phase shifters may be varied based on the verify signal.

In yet still further embodiments, the pattern signal may be transmitted based on a command from an ATE device. The pattern signal may be transmitted at a frequency higher than a frequency of test signals generated by the ATE device, and the higher frequency may correspond to an intended operating frequency of the memory interface.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

A memory interface may include a configuration of mixed-signal circuit components positioned between a) the controller and external memory chip on the other side of the channel, or b) the memory core of memory chip and memory controller from another chip on the other side of the channel. In order to test and validate a memory interface using automated test equipment (ATE), a memory controller device typically must be connected, via external pin connections, to a tester capable of emulating an external memory and providing proper response back to the memory controller device. Although such a test can fully simulate the function of the memory interface, the memory controller device can only be tested at an operating frequency of a rate that the ATE can support. Given that the operating frequency of memory protocols nearly being doubled generation over generation, common ATEs cannot test the newest memory controller devices at their intended operating speeds. Further, a tester that can support higher testing frequencies (e.g., beyond 1 GHz) are often prohibitively expensive, or burdensome for a vendor to continually replace to keep up with the speed progression of semiconductor devices. Without such equipment, a vendor may resort to a system-level testing to cover the high speed range on the memory interface, which can be time-consuming and difficult to scale.

Example embodiments of the present invention provide a memory interface including circuitry to conduct multiple different tests of the memory interface at a desired operating frequency. The included circuitry may create multiple different loops along the paths of the memory interface, propagate test patterns through those loops, and verify whether the patterns were properly propagated. Based on the results, it can be determined whether the components of the paths are operating within an acceptable tolerance. The memory interface can also communicate with ATE and a memory controller to initiate such tests and return the results to the ATE. As a result of embodiments of the invention, testing of a memory interface can be extended beyond ATE, and testing can be conducted at a frequency matching the intended operating frequency of the memory interface.

Figure 1:
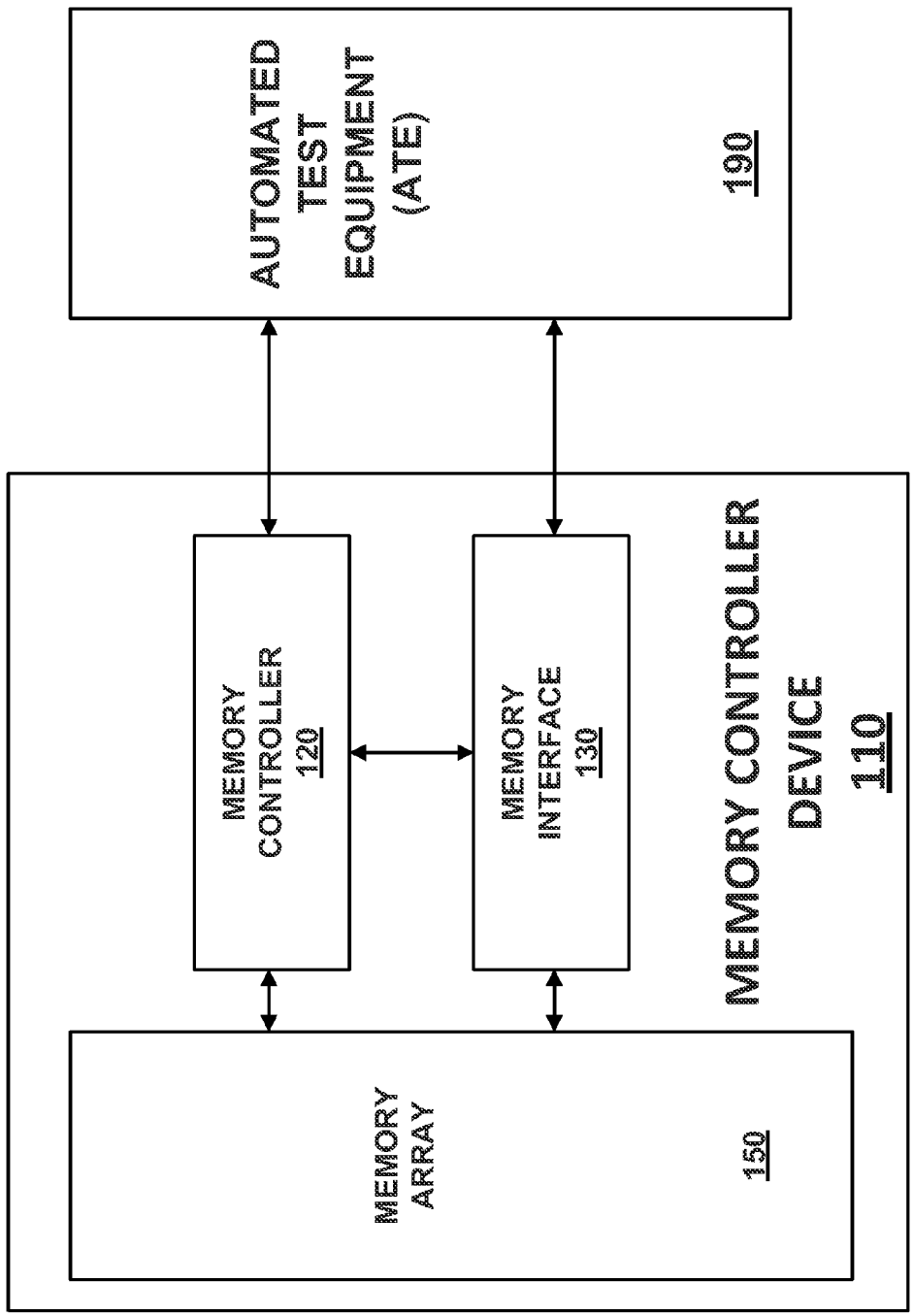
FIG. 1 is a block diagram of a memory controller device connected to automated test equipment (ATE) and implementing an embodiment of the invention.

FIG. 1 is a block diagram of a memory controller device 110 connected to an automated test equipment (ATE) apparatus 190 and implementing an embodiment of the invention. The memory controller device includes a memory array 150 (e.g., a DRAM or Flash memory array), a memory controller 120 configured to control access operations to the memory array 150, and a memory interface 130 configured to connect to external circuitry to send and receive data to and from the memory array 150. The memory controller device 110 may be connected, via external pin connections, to the ATE apparatus 190, in order to test one or more of the memory array 150, the memory controller 120, and the memory interface 130. ATE apparatus 190 can include one or more automated instruments capable of testing each of the components of the memory controller device 110, and may operate the memory controller device 110 through multiple different simulated memory access operations. In particular, the ATE may test the memory interface 130 in this manner, and verify that each transmit and receive path (and, by extension, the circuit components of each path) are working properly. A memory controller device 110 that fails such testing can be discarded or recalibrated and then subjected to further testing under the ATE 190.

Embodiments of the invention expand functional and alternating current (AC) timing test coverage of memory interface on automated test equipment (ATE). Functional testing can be conducted within the memory controller device 110, using circuitry within the memory interface 130 and memory controller 120, by looping back outgoing data paths through their corresponding incoming data paths within the memory interface 130. A randomized but deterministic pattern can be generated by a pattern generator at the memory interface 130 or memory controller 120, and the pattern can be propagated through the aforementioned looped paths. A pattern checker, located at the memory interface 130 or memory controller 120, may then check the pattern received through the loop to determine if it is the same pattern it sends out. The ATE apparatus 190 can initiate such tests via the memory controller 120 and receive the results of the tests. Through this exercise on ATE, semiconductor vendors can test out the data paths on the memory interface in both directions in a productive way to speed up mass production and provide meaningful quality control on their products. In addition, by adjusting the delay-line timing inside the memory interface 130, further tests can be conducted to test out the AC timing margin in the memory interface at its operating speed to ensure that the memory controller device 110, and memory interface 130 in particular, is well-qualified over extreme operation conditions.

Embodiments of the invention can further test a memory interface 130 through multiple different loopback configurations. Such multi-level loopback testing provides the flexibility to pinpoint a particular faulty circuit component. For example, a first level of loopback, called physical-level ("PHY-level") loopback, may loop back outgoing data paths to the corresponding incoming data paths up to the boundary between the physical layer ("PHY") and input/output (I/O) buffer circuits. A second level of loopback, called I/O-level loopback, extends loop-back paths up to I/O pin outs. With multi-level loopback capability, a semiconductor vendor may isolate the source of a fault detected by a loop-back test. A memory interface configured and tested under multiple different loopback tests is described in further detail below with reference to FIGS. 2-5.

Figure 2:
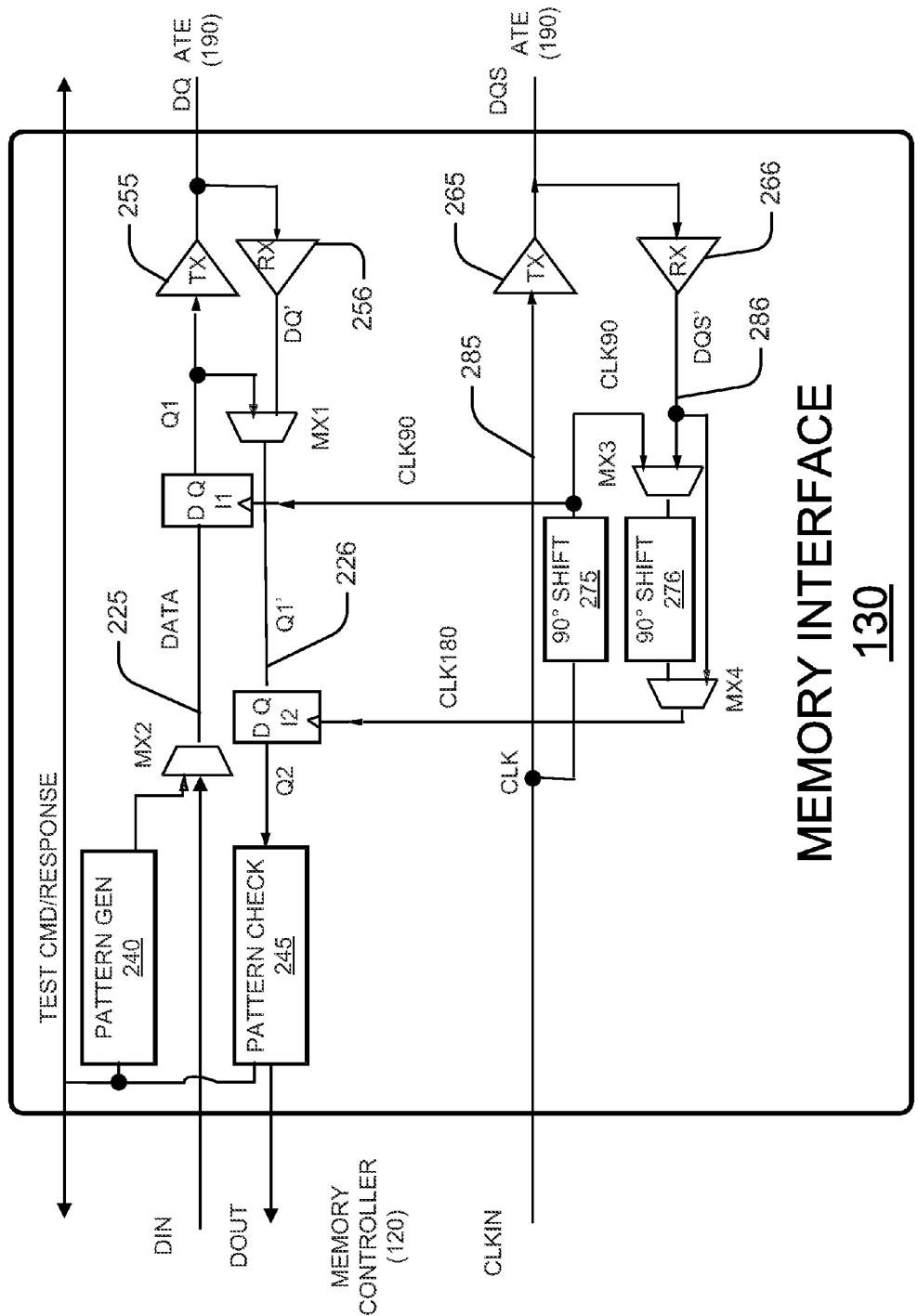
FIG. 2 is a block diagram of a memory interface in an embodiment of the invention.

FIG. 2 is a block diagram of a memory interface 130 in an embodiment of the invention. The memory interface 130 may be configured in a memory controller device 110 as described above with reference to FIG. 1, and may interface with a memory controller (e.g., memory controller 120) and an ATE apparatus (e.g., ATE apparatus 190). In alternative embodiments, where a test is conducted without connecting the memory interface 130 to an ATE apparatus, the memory interface may be connected to an external memory or other device. The memory interface 130 may include one or more data lines and respective data strobe lines, where the data line carries data signals bidirectionally between the memory controller (at pins DIN and DOUT), and the ATE apparatus (at pin DQ), and the data strobe line alternately carries a clock signal from the memory controller (at pin CLKIN) and a data strobe signal from the ATE (at pin DQS), depending on the direction of data transmission at the data line. The data line includes a transmit channel 225 and a receive channel 226. The data transmit channel 225 connects the data input (DIN pin) from the memory controller to the data pin DQ, and includes a latch I1 and a data transmit amplifier (e.g., a buffer) 255 for latching and transmitting data at the data pin DQ. The data receive channel 226 includes a data receive amplifier (e.g., a buffer) 256 and a latch I2 for receiving and latching data at the data pin DQ. The latches I1, I2 may include any circuitry configured to selectively store the state of a received signal, such as a flip-flop or SR latch.

The data strobe line enables clocking and latching of data on the data line, and includes a clock transmit channel 285 and a strobe receive channel 286. The clock transmit channel 285 includes a transmit amplifier 265 for transmitting a clock signal from the memory controller to an external device at the data strobe pin DQS. The strobe receive channel 286 includes a receive amplifier 266 for propagating a data strobe signal from an external device to clock the latches I1, I2. A pair of variable phase shifters 275, 276 may also be connected to the clock transmit channel 285 and strobe receive channel 286 to adjust the phase of the signals clocking the latches I1, I2. The variable phase shifters 275, 276 can be adjusted during and after testing in order to optimally align the clock and strobe signals to the data signal. Further, a multiplexer MX3 may select between the receive amplifier 266 and the variable phase shifter 275 outputs to clock received data at the latch I2. In order to minimize setup and hold time and achieve an optimal alignment between the data and data strobe signals, the variable phase shifters 275, 276 may be controlled (e.g., in response to the results of a loopback test) to maintain a 90-degree offset between the data and data strobe signals.

Under a normal operation mode (outside of a testing process), the memory interface may operate as follows: During an outgoing memory transmission, data from the memory controller 120 is sent to the memory interface 130, passing through the data transmission channel 225 at nodes DATA, Q1, and then reaching the pin DQ. The clock signal from the memory controller 120 may be used in the memory interface 130 to provide a 90-degree offset at node CLK90 (via the variable phase shifter 275) for the outgoing data and is also being transmitted out at pin DQS. As a result, both the data signal at DQ and clock at DQS may eventually be reached to an external memory or other device at the other side of the channel with a 90-degree offset.

Both DQ and DQS may be elements of a bidirectional bus, carrying incoming data signals and a data strobe in addition to the outgoing transmissions described above. Thus, during an incoming transaction under a normal operating mode, a data signal (e.g., from an external memory or other device) is received at the DQ pin to the receive amplifier 256, passing through nodes DQ', Q1', Q2' to reach the memory controller 120. Likewise, a data strobe signal may be received at pin DQS to the receive buffer 266, passing through DQS' and the variable phase shifter 276, and serves as the clock at node CLK180 to clock the incoming data at node Q1' via the latch I2.

In addition to the above components, the memory interface 130 may further include a pattern generator 240, a pattern checker 245, and multiplexers MX1, MX2, and MX4. During a test procedure, the pattern generator 240 may be configured to generate a pseudo-random, deterministic pattern signal, while the complementary pattern checker 245 may be configured to receive the pattern signal and compare the received pattern signal against a stored reference value, verifying whether the received pattern signal matches the stored reference value. Alternatively, the pattern generator 240 and pattern checker 245 may be located at the memory controller 120, and the memory interface may be configured to receive the pattern signal from the memory controller 120 and return the propagated pattern signal back to the memory controller 120. The multiplexer MX2 may selectively forward the pattern signal from the pattern generator 240 to the data transmit channel 225, and the multiplexer MX1 may selectively loop the data transmission channel 225 to the data receive channel 226 at node Q1, thereby selectively bypassing the amplifiers 255, 256 to provide two different loops through with the pattern signal may be propagated during the test procedure. Further, multiplexer MX4 may be configured to selectively pass either the output of the variable phase shifter 276 or the receive amplifier 266 to clock the latch I2 dependent on which of the aforementioned loops is enabled during the test.

Configuration of the memory interface 130 for testing procedures under different loopback configurations is described in further detail below with reference to FIGS. 3A-5.

Figure 3A:
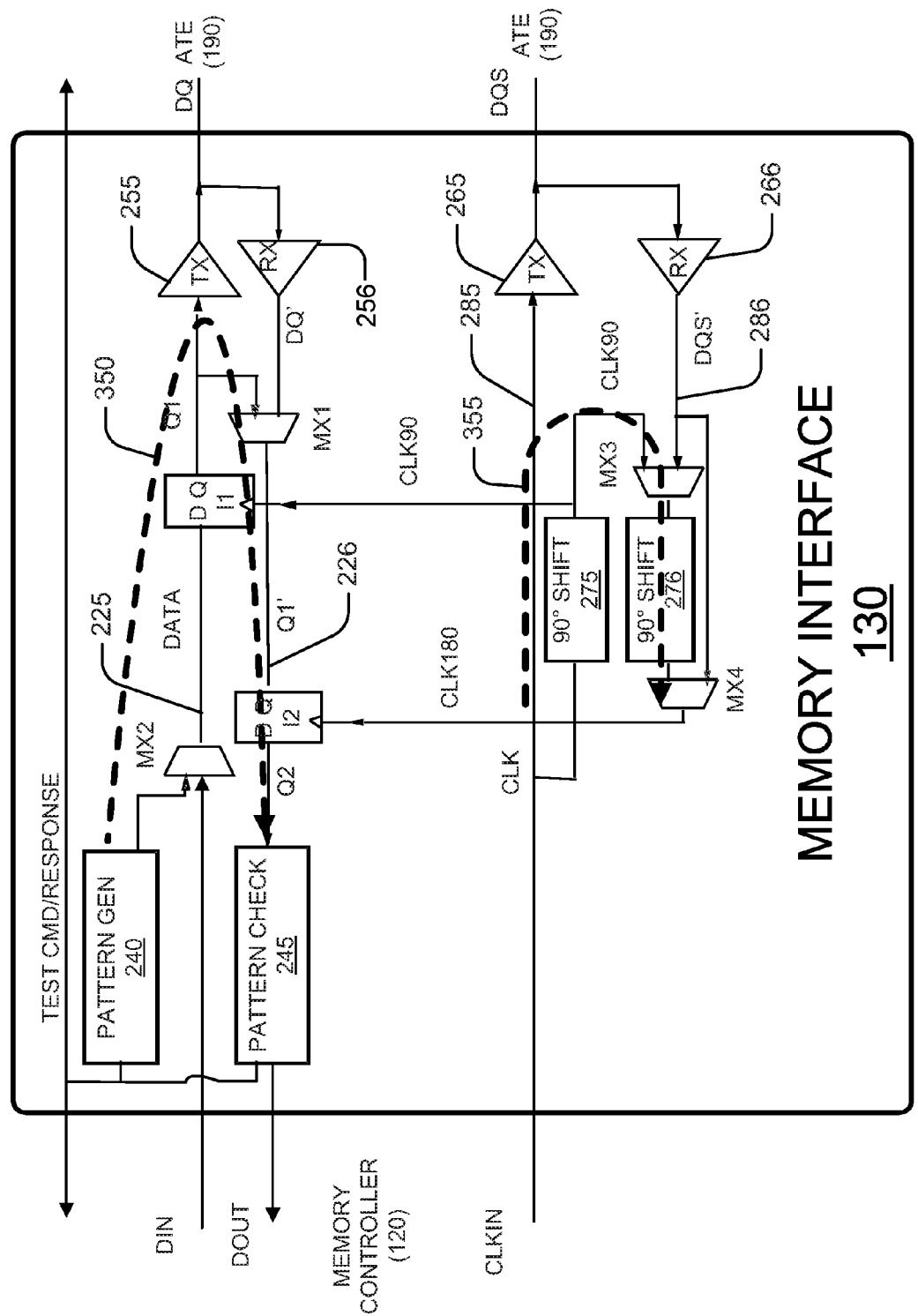
FIG. 3A is a block diagram of a memory interface configured for a first phase of a test.

FIG. 3A is a block diagram of a memory interface 130 configured for a first test mode. In this first test mode, the memory interface is configured in a first internal loopback. This first internal loopback may be referred to as physical-level ("PHY-level") loopback, and may create corresponding paths 350, 355 ("loops") that loop the outgoing data channel 225 back to the corresponding incoming data channel 226 up to the boundary between the physical layer ("PHY") and input/output (I/O) amplifier circuits 255, 256, and loop the data strobe line accordingly. This path may be contrasted with a second internal loopback, referred to as I/O-level loopback, which extends loop-back paths up to I/O pins DQ, DQS (described in further detail below with reference to FIGS. 4A-B).

In order to create the paths 350, 355, the memory controller 120 may control the multiplexers MX1, MX2, MX3, MX4 to selectively forward the inputs corresponding to the paths 350, 355. In particular, the multiplexer MX1 may be controlled to pass the input at node Q1, the multiplexer MX2 may be controlled to pass the input of the pattern generator 240, the multiplexer MX3 may be controlled to pass the output of the variable phase shifter 275, and the multiplexer MX4 may be controlled to pass the output of the variable phase shifter 276. The memory controller 120 may be directly connected to each of the multiplexers MX1-MX4, or may control the multiplexers MX1-MX4 via commands sent to a control interface (not shown) at the memory interface 130. The memory controller 120, in turn, may create the paths 350, 355 based on a command from an ATE apparatus 190 to perform a PHY-level loopback test.

Figure 3B:
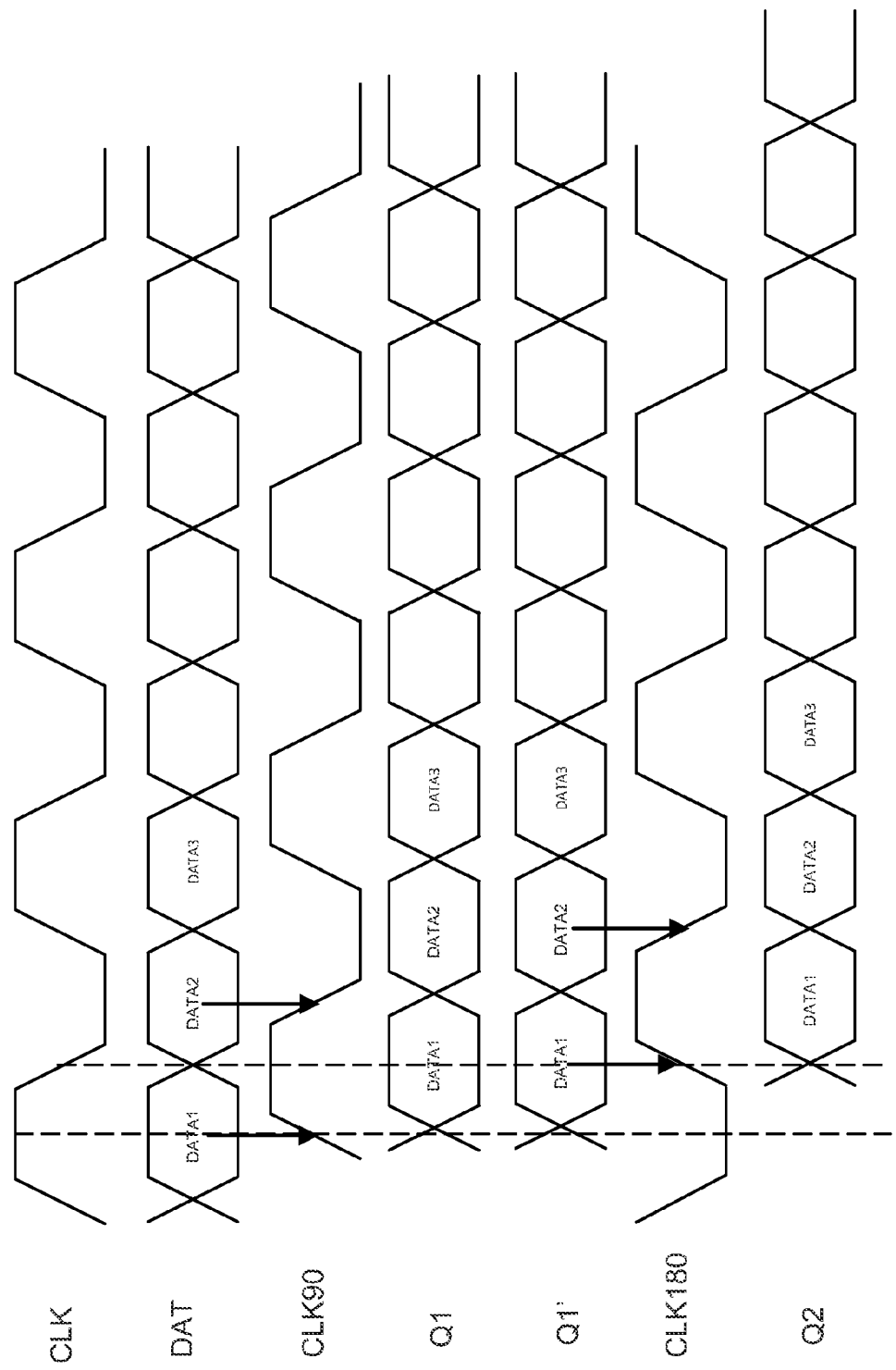
FIG. 3B is a timing diagram illustrating a test under the configuration of FIG. 3A.

Once the paths 350, 355 are created, the memory controller (e.g., in response to a command from an ATE apparatus 190) may cause the pattern generator 240 to generate a pseudo-random pattern signal, which propagates through the path 350, passing through node DATA, Q1, Q1' and Q2, and then returning to the pattern checker 245 to verify that the propagated pattern is intact. The pattern checker 245 may forward the result of this verification to the memory controller 120, where it may be further processed and returned to an ATE apparatus 190. The memory controller 120 may also account for the insertion delay through the paths 350, 355 and determine whether the outgoing and incoming pattern signals are matched with one another. Similarly, the data strobe signal may pass through the variable phase shifter 275, the output of which clocks the data signal at latch I1, and it is further looped back to the variable phase shifter 276, the output of which clocks the data signal at latch I2. A timing diagram illustrating the signals at the aforementioned nodes during an example PHY-level loopback test is shown in FIG. 3B.

Figure 4A:
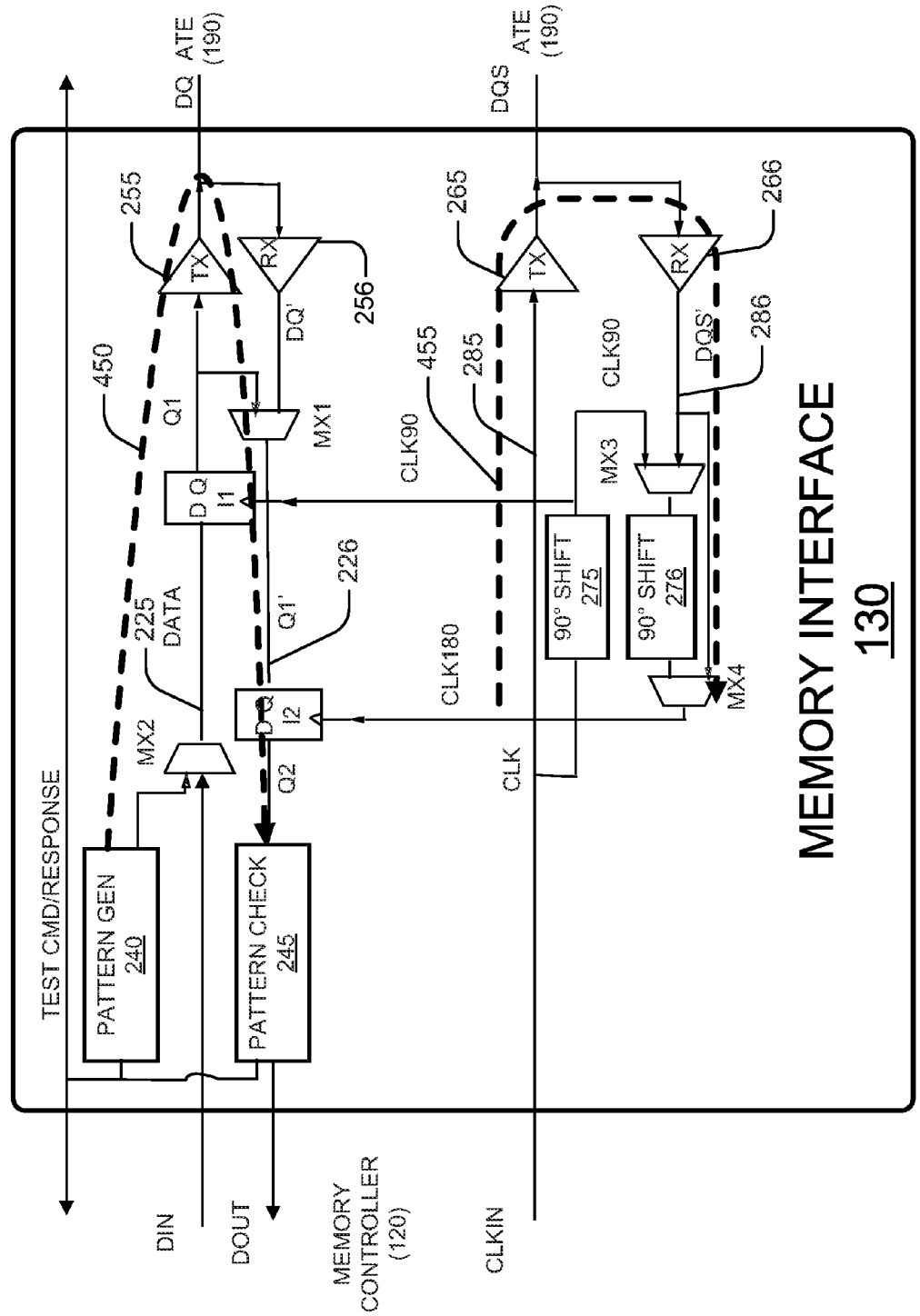
FIG. 4A is a block diagram of a memory interface configured for a second phase of a test.

FIG. 4A is a block diagram of a memory interface 130 configured for a second test mode. In this second test mode, the memory interface is configured in a second internal loopback. This second internal loopback may be referred to as an I/O level loopback, and may create corresponding paths 450, 455 that loop the outgoing data channel 225 back to the corresponding incoming data channel 226 up to the I/O pins DQ, DQS, and loop the data strobe line accordingly. This path may be contrasted with the first internal (PHY-level) loopback described above with reference to FIGS. 3A-B.

In order to create the paths 450, 455, the memory controller 120 may control the multiplexers MX1, MX2, MX3, MX4 to selectively forward the inputs corresponding to the paths 450, 455. In particular, the multiplexer MX1 may be controlled to pass the input at node DQ', the multiplexer MX2 may be controlled to pass the input of the pattern generator 240, and the multiplexer MX4 may be controlled to pass the output of the receive amplifier 266. In this mode, the multiplexer MX3 may be bypassed by the multiplexer MX4, and so need not be controlled. The memory controller 120 may be directly connected to each of the multiplexers MX1-MX4, or may control the multiplexers MX1-MX4 via commands sent to a control interface (not shown) at the memory interface 130. The memory controller 120, in turn, may create the paths 450, 455 based on a command from an ATE apparatus 190 to perform an I/O level loopback test.

Figure 4B:
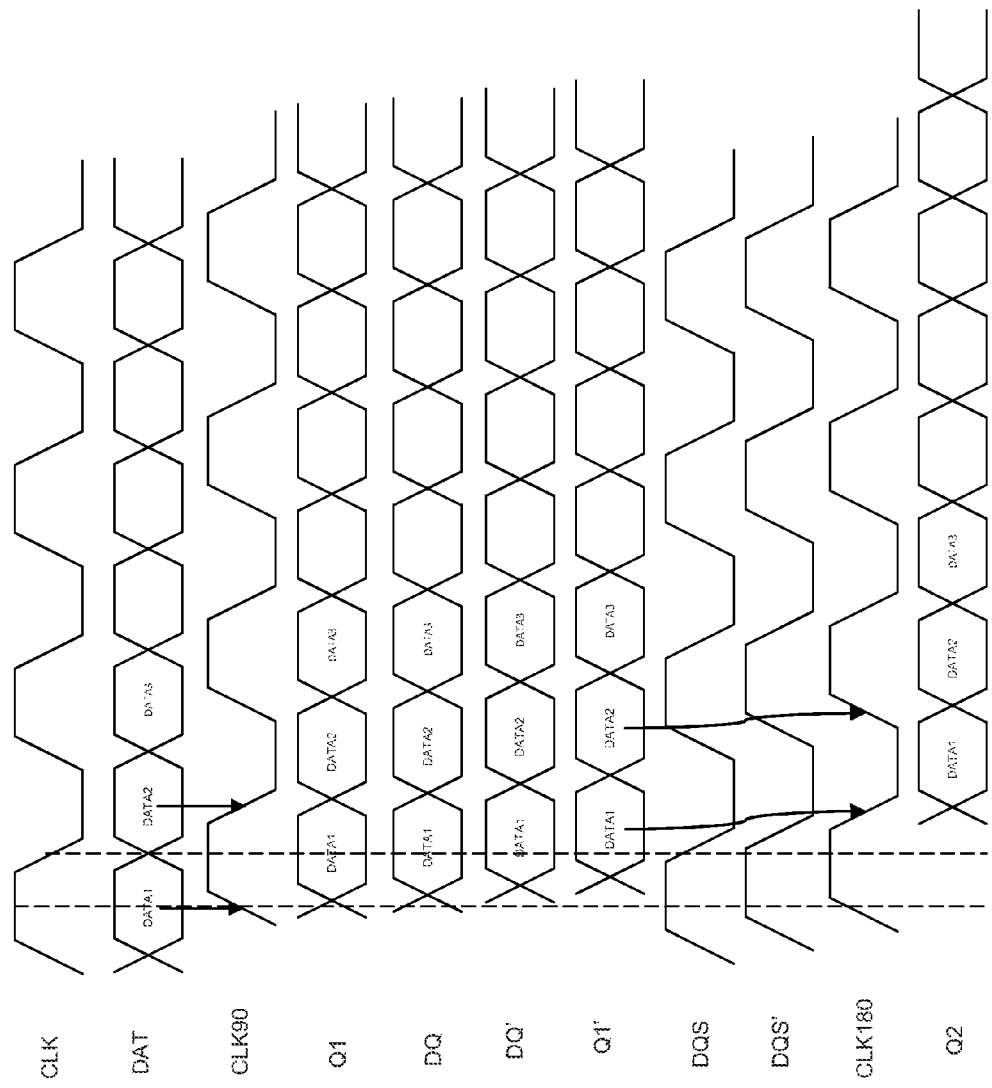
FIG. 4B is a timing diagram illustrating a test under the configuration of FIG. 4A.

Once the paths 450, 455 are created, the memory controller (e.g., in response to a command from an ATE apparatus 190) may cause the pattern generator 240 to generate a pseudo-random pattern signal, which propagates through the path 450, passing through node DATA, Q1, DQ, DQ', Q1' and Q2, and then returning to the pattern checker 245 to verify that the propagated pattern is intact. The pattern checker 245 may forward the result of this verification to the memory controller 120, where it may be further processed and returned to an ATE apparatus 190. The memory controller 120 may also account for the insertion delay through the paths 450, 455 and determine whether the outgoing and incoming pattern signals are matched with one another. Similarly, the data strobe signal may pass through the transmit and receive amplifiers 265, 266, and it is further looped back through the multiplexer MX4, the output of which clocks the data signal at latch I2. The data strobe signal is also received in parallel by the variable phase shifter 275, the output of which clocks the latch I1. A timing diagram illustrating the signals at the aforementioned nodes during an example I/O-level loopback test is shown in FIG. 4B.

In further embodiments, turning back to FIG. 2, the insertion delay through the transmit buffers 255, 265 on both the DQ and DQS pins may be controlled to be the same so that both data and data strobe signals can be maintained with a 90-degree offset both before and after the transmit buffers 255, 256. Likewise, the insertion delay through the receive buffers 256, 266 on both DQ and DQS pins may be controlled to be the same for the same reason. The PHY and I/O loopback tests describe above can aide in calibrating the memory interface 130 to achieve this result, by adjusting the variable phase shifters 275, 276 according to the results of those tests. Furthermore, the phase shifters 275, 276 can be varied between successive iterations of the PHY or I/O loopback tests, thereby stressing the timing margin on the sequential elements inside the memory interface. For example, by adjusting the delay on the variable phase shifter 275 in a PHY-level loopback test, the rising and falling edge of CLK90 can be moved away from its ideal center point in the middle of data pattern, testing the setup and hold time margin of the sequential elements on the outgoing data paths. CLK90 can be shifted to a point, left or right, until pattern matching check fails to find a matching pattern during a successive PHY loopback test. This point of failure can indicate a boundary condition, (e.g., an AC timing margin), of a given sequential element under test.

Further, by adjusting the delay on the variable phase shifter 276 in a PHY-level loopback test, the rising and falling edge of CLK180 can be moved away from its ideal center point of the incoming data paths until pattern is no longer matched during a successive PHY loopback test. This process can provide an indication of a boundary condition on the sequential elements of the incoming data paths. By testing the memory interface 130 in this manner, embodiments of the invention can provide visibility of an internal AC timing margin, which may not be otherwise observed on the silicon directly. This visibility can be beneficial for 1) characterizing setup and hold time of the sequential elements on the data paths, 2) qualifying silicon with stress timing to enhance quality control, and 3) providing timing margin information useful for future clock speed increases.

Figure 5:
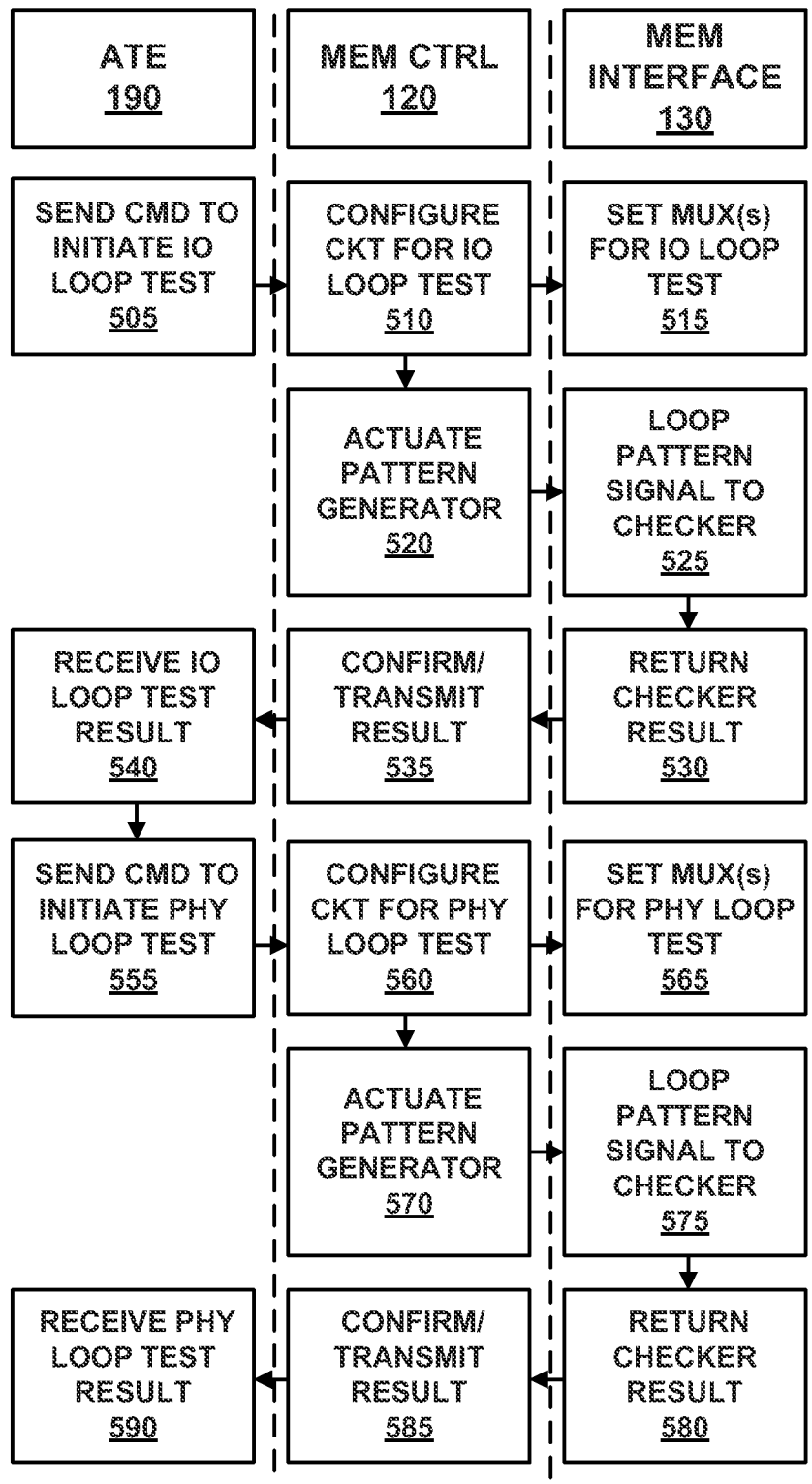
FIG. 5 is a flow diagram illustrating a method of testing a memory interface in one embodiment.

FIG. 5 is a flow diagram illustrating a method 500 of testing a memory interface in one embodiment. The method may be performed, for example, by the ATE 190 and memory controller device 110 described above with reference to FIG. 1, and may implement the PHY-level and I/O level loopback tests described above with reference to FIGS. 3A-4B.

With reference to FIG. 1, an ATE apparatus 190 may initiate an I/O loop test by sending a corresponding command to the memory controller 120 (505). In response, the memory controller 120 may configure the memory interface 130 for the I/O loopback test (510). Specifically, the multiplexers at the memory interface 130 may be set to create the loops corresponding to the I/O loopback test, such as in the configuration described above with reference to FIG. 4A (515). Once the loops are created, the memory controller may then actuate the pattern generator (located either at the memory controller 120 or the memory interface 130) (520) to loop a pattern signal through the data line loop to the pattern checker (located either at the memory controller 120 or the memory interface 130) (525). If the pattern checker is located at the memory interface 130, then the memory interface 130 returns the checker result (530), which can be further verified or processed by the memory controller 120 (535) and returned to the ATE apparatus (540).

Based on the results of the I/O loopback test, the ATE 190 may determine whether to perform further testing. For example, if the pattern checker indicates a fault, then the I/O-level test may be repeated (505-540) to confirm the result. Further, the ATE 190 may initiate a PHY-level loopback test in order to isolate the circuit components other than the I/O amplifiers of the memory interface. To do so, the ATE apparatus 190 may initiate sending a corresponding command to the memory controller 120 (555). In response, the memory controller 120 may configure the memory interface 130 for the PHY loopback test (560). Specifically, the multiplexers at the memory interface 130 may be set to create the loops corresponding to the PHY loopback test, such as in the configuration described above with reference to FIG. 3A (565). Once the loops are created, the memory controller may then actuate the pattern generator (570) to loop a pattern signal through the data line loop to the pattern checker (575). If the pattern checker is located at the memory interface 130, then the memory interface 130 returns the checker result (580), which can be further verified or processed by the memory controller 120 (585) and returned to the ATE apparatus (590).

Upon completing the PHY-level loopback test (555-590), the ATE 190 may further compare the results of the I/O-level and PHY-level test to determine more accurately the cause of a fault. For example, a successful PHY-level test and an unsuccessful I/O-level test may indicate a defective I/O amplifier or pin connection. This information can be used to further diagnose or reconfigure the memory interface. In addition, the ATE may conduct further tests. For example, the ATE 190 may conduct a series of PHY-level loopback tests while adjusting the variable phase shifters of the memory interface 130, as described above with reference to FIG. 2. Such a test can be used to characterize setup and hold time of the memory interface 130, as well as provide timing margin information for calibrating the memory interface 130.

While this invention has been particularly shown and described with references to example embodiments thereof, it will be understood by those skilled in the art that various changes in form and details may be made therein without departing from the scope of the invention encompassed by the appended claims.

What is claimed is:

1. A circuit comprising:
   a data line having a transmit channel and a receive channel connected in parallel to a data pin, the transmit channel including a transmit amplifier and a transmit latch, the receive channel including a receive amplifier and a receive latch;
   a data strobe line having a strobe transmit channel and a strobe receive channel connected in parallel to a data strobe pin, the strobe transmit channel connected to a clock input of the transmit latch, the strobe receive channel connected to a clock input of the receive latch;
   a pattern generator connected to the transmit channel;
   a control circuit configured to actuate the pattern generator to generate a pattern signal to the transmit channel; and
   a pattern checker connected to the receive channel, the pattern checker configured to receive the pattern signal at the receive channel and output a verify signal indicating integrity of the pattern signal;
   a multiplexer connected in series to the receive channel between the receive amplifier and the receive latch, the multiplexer having a second input connected to the transmit channel at a node between the transmit latch and the transmit amplifier;
   wherein the control circuit is further configured to 1) in a first test mode, actuate the pattern generator and the multiplexer to propagate the pattern signal through a first loop including the transmit channel, the receive channel, the transmit amplifier and the receive amplifier, and 2) in a second test mode, actuate the pattern generator and the multiplexer to propagate the pattern signal through a second loop including the transmit channel and the receive channel and excluding the transmit amplifier and the receive amplifier.

2. The circuit of claim 1, wherein the control circuit is further configured to control the multiplexer to selectively bypass the transmit amplifier and receive amplifier during propagation of the pattern signal.

3. The circuit of claim 1, wherein the multiplexer is a first multiplexer, and further comprising a second multiplexer connected in series to the transmit line between a data source and the transmit latch, the second multiplexer having another input connected to the pattern generator.

4. The circuit of claim 3, wherein the control circuit is configured to control the pattern generator and first and second latches to selectively propagate the pattern signal through at least one of a first and second path through at least a subset of the data line.

5. The circuit of claim 4, wherein the first path includes the transmit latch and the receive latch and excludes the transmit amplifier and receive amplifier, and wherein the second path includes the transmit latch, transmit amplifier, receive amplifier and receive latch.

6. The circuit of claim 1, further comprising a multiplexer connected in series to the transmit line between a data source and the transmit latch, the multiplexer having an input connected to the pattern generator.

7. The circuit of claim 1, wherein the strobe transmit channel and the strobe receive channel include a strobe transmit amplifier and a strobe receive amplifier, respectively, and further comprising:
 a first variable phase shifter at the strobe transmit channel, the first variable phase shifter having an input connected to a clock source and an output connected to the clock input of the transmit latch; and
 a second variable phase shifter at the strobe receive channel, the second variable phase shifter having an input connected to the strobe receive amplifier and an output connected to the clock input of the receive latch.

8. The circuit of claim 7, further comprising:
 a first multiplexer having inputs connected to the output of the first variable phase shifter and an output of a strobe receive amplifier; and
 a second multiplexer having inputs connected to the output of the second variable phase shifter and the output of the strobe receive amplifier.

9. The circuit of claim 8, wherein the control circuit is further configured to control the first and second multiplexers to selectively bypass the strobe receive amplifier and the second variable phase shifter during propagation of a clock signal from the clock source.

10. The circuit of claim 8, wherein the control circuit is configured to control the first and second multiplexers to selectively enable a clock signal from the clock source through at least one of a first and second path through at least a subset of the data strobe line.

11. The circuit of claim 10, wherein the first path includes the first variable phase shifter and the second variable phase shifter and excludes the strobe transmit amplifier and strobe receive amplifier, and wherein the second path includes the strobe transmit amplifier and strobe receive amplifier and excludes the first variable phase shifter and the second variable phase shifter.

12. The circuit of claim 7, wherein the control circuit is further configured to vary delay of at least one of the first and second variable phase shifters.

13. The circuit of claim 12, wherein the control circuit varies the delay based on an output of the pattern checker.

14. The circuit of claim 1, wherein the control circuit is further configured to actuate the pattern generator based on a command signal from an automated testing equipment (ATE) device.

15. The circuit of claim 14, wherein the pattern generator generates the pattern signal at a frequency higher than a frequency of test signals transmitted to the circuit from the ATE device.

16. The circuit of claim 1, wherein the pattern generator, control circuit, pattern checker and at least a portion of the data line and data strobe line are implemented in a common integrated circuit (IC).

17. A method of verifying operation of a memory interface, comprising:
 transmitting a pattern signal through a path through at least a portion of a data line, the data line having a transmit channel and a receive channel connected in parallel to a data pin;
 in a first test mode, actuating a multiplexer to propagate the pattern signal through a first loop including a transmit channel, the receive channel, a transmit amplifier and a receive amplifier;
 in a second test mode, actuating the multiplexer to propagate the pattern signal through a second loop including the transmit channel and the receive channel and excluding the transmit amplifier and the receive amplifier
 receiving the pattern signal at a termination of the path;
 comparing the pattern signal against a reference value; and
 outputting a verify signal indicating integrity of the pattern signal based on the comparison.

18. The method of claim 17, further comprising:
 transmitting a clock signal through a strobe path through at least a subset of a data strobe line, the data strobe line having a strobe transmit channel and a strobe receive channel connected in parallel to a data strobe pin.

19. The method of claim 18, wherein the strobe path is one of a first strobe path and a second strobe path, and further comprising:
 selecting the strobe path from one of the first and second strobe paths.

20. The method of claim 19, first strobe path includes a first variable phase shifter and a second variable phase shifter and excludes a strobe transmit amplifier and a strobe receive amplifier, and wherein the second strobe path includes the strobe transmit amplifier and strobe receive amplifier and excludes the first variable phase shifter and the second variable phase shifter.

21. The method of claim 20, further comprising varying delay of at least one of the first and second variable phase shifters based on the verify signal.

22. The method of claim 17, wherein transmitting the pattern signal is based on a command from an automated testing equipment (ATE) device.

23. The method of claim 22, wherein transmitting the pattern signal includes transmitting the pattern signal at a frequency higher than a frequency of test signals generated by the ATE device.

* * * * *